United States Patent
Montuschi et al.

(10) Patent No.: US 6,552,473 B2
(45) Date of Patent: Apr. 22, 2003

(54) CONTROL VALVE WITH A SELF-COMPENSATING PIEZOELECTRIC ACTUATOR

(75) Inventors: Mario Montuschi, Turin (IT); Eugenio Faggioli, Turin (IT)

(73) Assignee: C. R. F. Societa Consortile per Azioni, Turin (IT)

( * ) Notice: Subject to any disclaimer, the term of this patent is extended or adjusted under 35 U.S.C. 154(b) by 0 days.

(21) Appl. No.: 09/893,469

(22) Filed: Jun. 29, 2001

(65) Prior Publication Data

US 2002/0017833 A1 Feb. 14, 2002

(30) Foreign Application Priority Data

Jun. 30, 2000 (IT) ................................ TO2000A000653

(51) Int. Cl.[7] ............................................... H01L 41/08
(52) U.S. Cl. ...................................................... 310/328
(58) Field of Search .................................. 310/328, 317

(56) References Cited

U.S. PATENT DOCUMENTS

| | | |
|---|---|---|
| 451,578 A | 5/1891 | Richards |
| 853,490 A | 5/1907 | West |
| 1,747,223 A | 2/1930 | Campbell |
| 1,850,477 A | 3/1932 | Roth |
| 3,265,348 A | 8/1966 | Sylvester |
| 3,774,668 A | 11/1973 | Iten et al. |
| 3,863,704 A | 2/1975 | Kahn |
| 3,882,942 A | 5/1975 | Rohatgi et al. |
| 3,929,184 A | 12/1975 | Reuter et al. |
| 4,008,749 A | 2/1977 | Bellocci et al. |

(List continued on next page.)

FOREIGN PATENT DOCUMENTS

| | | |
|---|---|---|
| AU | 19788 | 10/1935 |
| DE | 352309 | 4/1922 |
| DE | 477 287 | 6/1929 |
| DE | 529 838 | 7/1931 |
| DE | 680 515 | 8/1939 |

(List continued on next page.)

OTHER PUBLICATIONS

Campbell, "Solidification Dynamics", Castings, 1991, pp. 131–133 and 230, Butterworth–Heinemann Ltd., Oxford, U.S.A.

Beeley, "Solifidication 2: The Feeding of Castings", Foundry Technology, pp. 128–131, Newnes–Butterworths.

Heine, et al., "Principles of Metal Casting", Principles of Metal Casting, 1967, pp. 244–247, McGraw–Hill, Inc., U.S.A.

Smith, et al., "Low Pressure Sand Casting: Current Experience With a New Process", AFS Transactions, pp. 785–792.

Hetke, "Aluminum Casting Quality in Alloy 356 Engine Components", ICA Castings Intermet–Comalco Aluminum, pp. 1–24.

(List continued on next page.)

Primary Examiner—Mark O. Budd
(74) Attorney, Agent, or Firm—Sughrue Mion, PLLC

(57) ABSTRACT

An actuator for a control valve includes a piezoelectric actuating member for bringing about the movement of a closure member of the valve between an open position and a closure position; the member has a reference portion for connection to a fixed portion of the device and a free portion for connection to the closure member, the free portion being movable relative to the reference portion as a result of mechanical deformations produced in the actuating member by the piezoelectric effect. The reference portion of the actuating member is controllable selectively between a condition in which it is locked in a reference position and is fixed firmly to the fixed portion of the device, and a free condition in which it is movable relative to the fixed portion.

13 Claims, 3 Drawing Sheets

U.S. PATENT DOCUMENTS

| | | | | |
|---|---|---|---|---|
| 4,629,039 | A | * 12/1986 | Imoto et al. | 310/328 X |
| 4,629,926 | A | * 12/1986 | Siegal | 310/328 X |
| 4,690,465 | A | * 9/1987 | Takeda et al. | 310/328 X |
| 4,733,714 | A | 3/1988 | Smith | |
| 4,769,569 | A | * 9/1988 | Stahlhuth | 310/328 |
| 4,875,518 | A | 10/1989 | Imura et al. | |
| 4,929,859 | A | * 5/1990 | Suzuki et al. | 310/328 |
| 4,993,473 | A | 2/1991 | Newcomb | |
| 5,072,773 | A | 12/1991 | Ruff et al. | |
| 5,297,611 | A | 3/1994 | Legge et al. | |
| 5,477,906 | A | 12/1995 | Legge et al. | |

FOREIGN PATENT DOCUMENTS

| | | |
|---|---|---|
| DE | 2 147 678 | 4/1972 |
| DE | 24 08 032 A1 | 9/1975 |
| FR | 611.853 | 10/1926 |
| FR | 1.100.788 | 9/1955 |
| GB | 520598 | 4/1940 |
| GB | 1028736 | 5/1966 |
| GB | 2 080 714 A | 2/1982 |
| GB | 2 187 984 A | 9/1987 |
| JP | 53-11830 | 2/1978 |
| JP | 55-136556 | 10/1980 |
| JP | 61-23565 | 2/1986 |
| JP | 59-44365 | 3/1987 |
| JP | 64-53758 | 3/1989 |
| JP | 2-192872 | 7/1990 |

OTHER PUBLICATIONS

Plutshack, et al., "Riser Design", Metals Handbook Ninth Edition, 1988, pp. 577–588, vol. 15, ASM International, U.S.A.

Sokolowski, et al., "Analysis of the Controlled Solidification Process of 1.6 L Cylinder Head Castings", Current Aluminum Research and Applications 87, 1988, pp. 41–44, American Foundrymen's Society, Inc., U.S.A.

Jorstad, et al., Aluminum Casting Technology, 1993, pp. 280–281, American Foundrymen's Society, Inc., U.S.A.

Casting Kaiser Aluminum, 1974, pp. 340–345 and 426–431, Kaiser Aluminum & Chemical Sales, Inc., Oakland, U.S.A.

Aluminum Casting Technology, 1986, pp. 178–181, American Foundrymen's Society, Inc., Des Plaines, U.S.A.

Lavington, "The Cosworth Process—A New Concept in Aluminum Alloy Casting Production".

* cited by examiner

CONTROL VALVE WITH A SELF-COMPENSATING PIEZOELECTRIC ACTUATOR

FIELD OF THE INVENTION

The present invention relates to an actuator device for a control valve and, more particularly, to a piezoelectric actuator device of the type referred to in the preamble to claim 1.

BACKGROUND OF THE INVENTION

The solution of operating a control valve, for example, a fuel-injection control valve, by means of piezoelectric actuators is known. These devices utilize the mechanical deformation of a piezoelectric element, and preferably of a more complex member such as a bar formed by a series of such elements, for bringing about the operation of a valve-closure member.

Conventionally, the mechanical deformation of the piezoelectric bar consists of a "positive" change in its length along its longitudinal axis, that is, of an elongation of the bar relative to its rest dimension (in order not otherwise to cause mechanical detachment of the elements "in series"). This elongation leads to linear translation of a free end of the bar, which end is connected to the closure member, relative to the fixed valve body on which the opposite end of the bar is restrained, and consequently causes the closure member to travel between an open position and a closure position, relative to the valve seat.

The mechanical deformation due to the piezoelectric effect is normally very small, of the order of a few tens of microns, and is thus comparable to the dimensional variations produced by the range of temperature variation which is established during the operation of the devices with which the control valve is associated, and to their manufacturing tolerances.

A further problem is that of ensuring efficient operation of the actuator upon the occurrence of long-term intrinsic drift, due particularly to the mechanical components associated with the actuator, for example, owing to wear of the valve seat and the closure member, which is also of a magnitude comparable to the deformations due to the piezoelectric effect.

SUMMARY OF THE INVENTION

The aim of the invention is to provide a piezoelectric actuator for a control valve which does not have the disadvantages of the devices of the prior art but which enables the travel of the valve closure member to be controlled effectively, irrespective of the manufacturing tolerances involved and/or of spurious dimensional alterations of the piezoelectric actuating member which may occur during the operation of the device.

According to the present invention, this aim is achieved by means of an actuator having the characteristics recited in claim 1.

In summary, the present invention is based on the principle of restraining one end of the piezoelectric actuating member adjustably on the fixed reference body of the valve relative to which the mechanical deformations of the member are defined, and hence with the ability to compensate for the initial tolerances and for all of the possible spurious dimensional variations which may occur (thermal deformations, long-term dimensional alterations).

In other words, the coupling between the piezoelectric actuating member and the fixed reference body of the valve is formed in a manner such as to be variable and adjustable in operation, so that the system can be said to be self-compensating.

The adjustable connection can be achieved by electromagnetic, piezoelectric, or hydraulic means, either directly or by means of an intermediate member, as will be described in detail below with reference to the currently-preferred embodiments.

The invention provides for an electronic system for adjusting the connection between the piezoelectric actuating member and the fixed reference body to be integrated with the electronic control system of the actuator device, directly in the valve body; temperature control (basically cooling) thereof may be achieved by means of the fluid controlled by the valve, in accordance with a known solution.

BRIEF DESCRIPTION OF THE DRAWINGS

Further characteristics and advantages of the invention will be explained in greater detail in the following detailed description of preferred embodiments thereof, given by way of non-limiting example with reference to the appended drawings, in which.

DETAILED DESCRIPTION OF THE PREFERRED EMBODIMENTS

Figure 1:
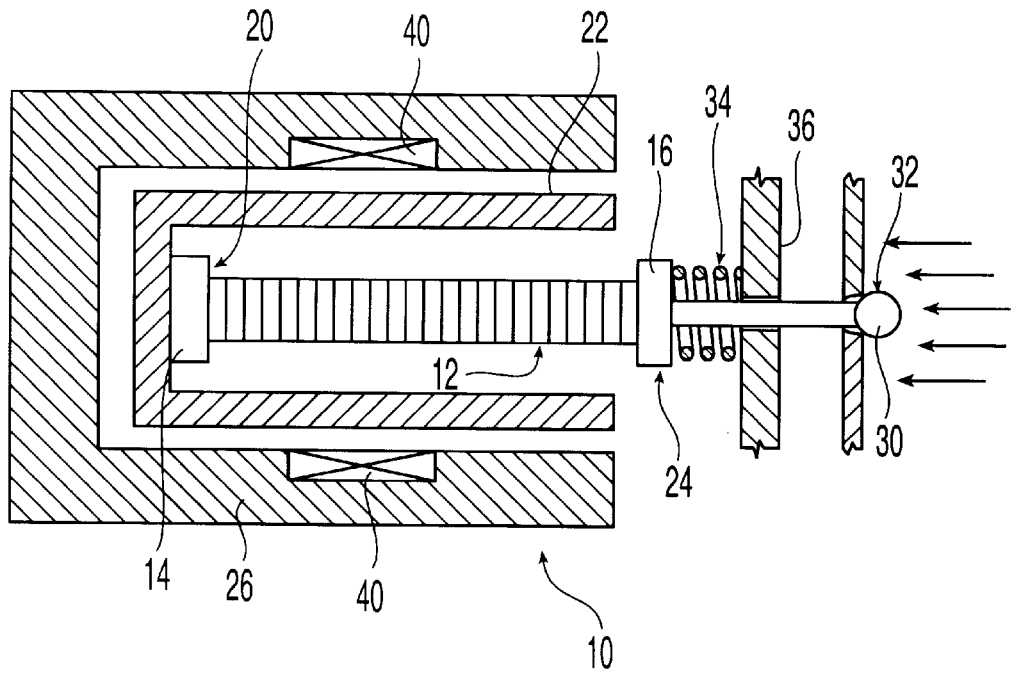
FIG. 1 is a schematic illustration, in longitudinal section, of a first embodiment of an actuator device for a control valve according to the invention, in which the coupling between the piezoelectric actuating member and the fixed reference body of the valve is achieved by electromagnetic means.

A piezoelectric actuator device according to a first embodiment of the invention is shown partially and indicated 10 in FIG. 1. In this example, a possible application to an on-off control valve for the injection of fuel or diesel fuel is described but this possible use, which is adopted herein for simplicity of discussion, should be understood as purely indicative.

The actuator device 10 comprises an elongate piezoelectric actuating member 12 oriented along a longitudinal axis of the device and composed of a plurality (a stack) of elements arranged in succession between a pair of end electrodes 14, 16.

A first end 20 of the piezoelectric member is fixed mechanically on a movable, cup-shaped support member 22 and its second end 24 is free relative to the support member 22 and, in particular, can translate longitudinally as a result of variations in the length of the actuating member 12 due to its piezoelectric properties.

The support member 22, which is made of ferromagnetic material, is housed and can slide axially with slight friction in a coaxial, fixed reference body 26 which is also cup-shaped and made of ferromagnetic material. The possible travel is small and is of the order of the tolerances and of the dimensional variations to be corrected (a few tenths of a millimeter). The sliding is advantageously arranged to take place after lubrication of the parts by means of the fluid controlled, which is caused to enter this region in a "discharge" stage.

The actuating member 12 carries, at its free end 24, a closure member 30 of the valve which can engage in a corresponding seat 32 in order to regulate the flow of the fluid under control.

The closure member 30 is normally kept in the closure position by the action, in compression, of a spring 34 arranged between the free end 24 of the actuating member 12 and a wall 36 fixed firmly to the fixed body of the valve and having an axial guide hole for the sliding of the stem of the closure member. The closure member is also kept closed by the pressure of the fluid to be controlled, indicated by the arrows in the drawing.

The fixed reference body 26 also has, on at least a longitudinal portion of its side wall, an electrical winding arranged in a manner such as to form a coaxial locking electromagnet 40.

In this embodiment, the adjustable connection between one end of the piezoelectric actuating member 12 and the fixed reference body 26 is achieved by electromagnetic means.

In the rest condition, the closure member 30 is in the closure position. The spring 34 can keep the closure member in this position even in the absence of fluid pressure, overcoming the frictional forces between the support member 22 and the fixed reference body 26 so as to ensure reasonable safety margins. The support member 22 is freely slidable in the fixed reference body 26.

The closure position defined by the action of the spring 34 and by the fluid pressure takes account of the actual dimensions of the piezoelectric member and of the mechanical components of the valve at rest, as well as of the manufacturing tolerances involved. In dependence on this position, the support member 22 reaches a first reference position in the fixed body 26.

When the actuator device is activated, the energized electromagnet 40 acts to lock the support member 22 in its current position relative to the body 26 by radial attraction and friction. The support member 22 is thus held firmly to the fixed reference body 26.

The valve is opened by exciting the piezoelectric member 12 electrically by means of the end electrodes 14, 16 in a manner such as to bring about axial extension thereof, that is, to cause its free end 24 to translate relative to the end 20 which is fixed to the body 26, overcoming the opposing force of the spring 34 and hence—to sum up—moving the closure member 30 away from the seat 32 and opening the outlet opening of the valve.

The operation of the actuator according to the invention is characterized by a high degree of precision since the deformations in length of the piezoelectric actuating member 12 are transmitted to the valve closure member 30 as a control useful for varying its position relative to its seat 32 and not for also taking up the spurious dimensional variations arising in the device.

The closure member can be returned rapidly to the closure position by cancelling the control of the actuating member 12 or even by providing a suitable control of opposite sign, without, however, inducing substantial contraction deformations since they are not tolerable, for example, by the piezoelectric material conventionally used (a series of "stacked" discs).

This latter solution may, however, be adopted effectively in the device according to the invention since this device ensures practically zero tolerances at any moment of the operative life of the device.

The locking electromagnet 40 advantageously does not require fast response rates and therefore has a low power consumption.

During continuous operation of the actuator device, progressive heating normally takes place, possibly causing dimensional variations of the components. The locking electromagnet 40 is therefore de-energized periodically so as to permit relative (micrometric) movements between the support member 22 of the piezoelectric member 12 and the fixed reference body 26 such as to take up the spurious dimensional variations occurring in the device.

Figure 5:
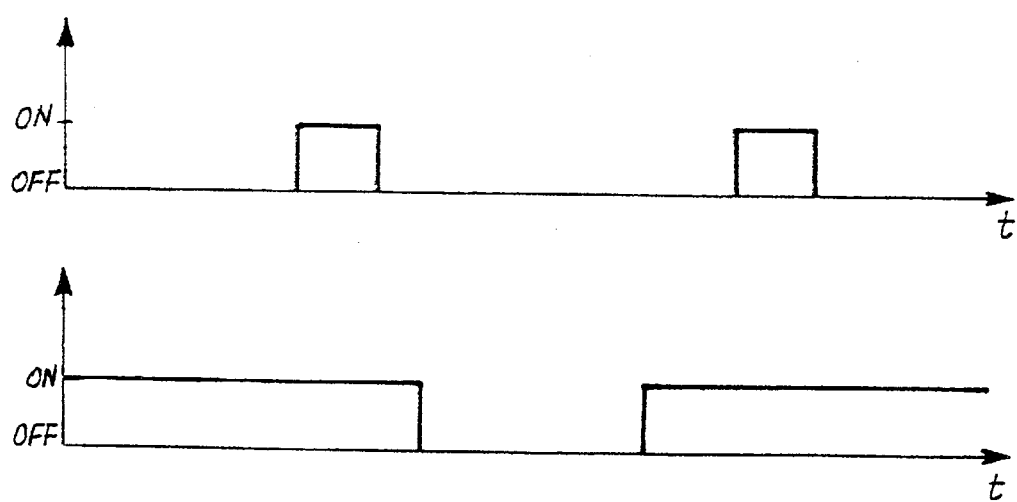
FIG. 5 shows a series of time graphs which represent the operation of the actuator device according to the invention.

An example of the controls for the operation and adjustment of the device is shown in the graphs of FIG. 5. The upper graph shows, on a time scale, a portion of the control signals for the actuating member 12 in which two successive stages of actuation (ON) of the valve can be seen. The corresponding lower graph shows a portion of the control signals (energization and de-energization) for the locking electromagnet 40, for the fine adjustment of the reference position. De-energization (OFF) is brought about in dependence on the dynamics of the system, for example, every 100 valve control pulses.

The ability to adjust the reference position of the actuating member 12 relative to the fixed body of the valve periodically, even at frequencies greater than that indicated, leads to a further advantage: that is, the fact that the member 12 can be made of materials which have a high degree of mechanical deformation for small control voltages, but which have poor characteristics of accuracy, mechanical stability, and thermal expansion. In particular, this solution opens the way to the use of actuator devices of the type described, with relatively large travel, for controlling the lifting of engine valves.

Figure 2:
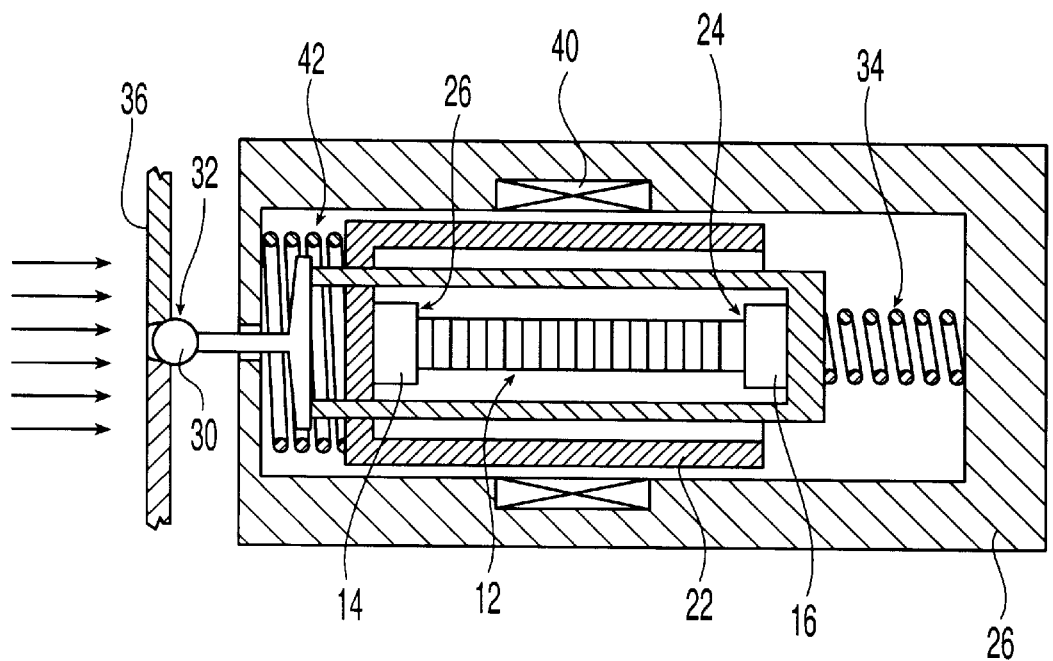
FIG. 2 is a schematic illustration, in longitudinal section, of a second embodiment of the device according to the invention, in which the coupling between the piezoelectric actuating member and the fixed reference body of the valve is achieved by electromagnetic means.

A second embodiment of the actuator device with adjustable connection achieved by electromagnetic means is shown in FIG. 2 in which identical or functionally equivalent elements or components are indicated by the same reference numerals.

As will be clear to a person skilled in the art, the solution is achieved by a simple reversal of the embodiment of FIG. 1. In particular, a simpler closure-member unit is shown, in which the stem does not occupy part of the valve outlet opening. However, in addition to the compression spring 34 which acts on the free end 24 of the piezoelectric actuating member 12 to keep the closure member 30 in a rest, closure position, this embodiment provides for the use of a second, contact spring 42 for controlling the travel of the support member 22 in the fixed reference body 26, keeping the piezoelectric discs of the "stack" always "in contact".

Figure 3:
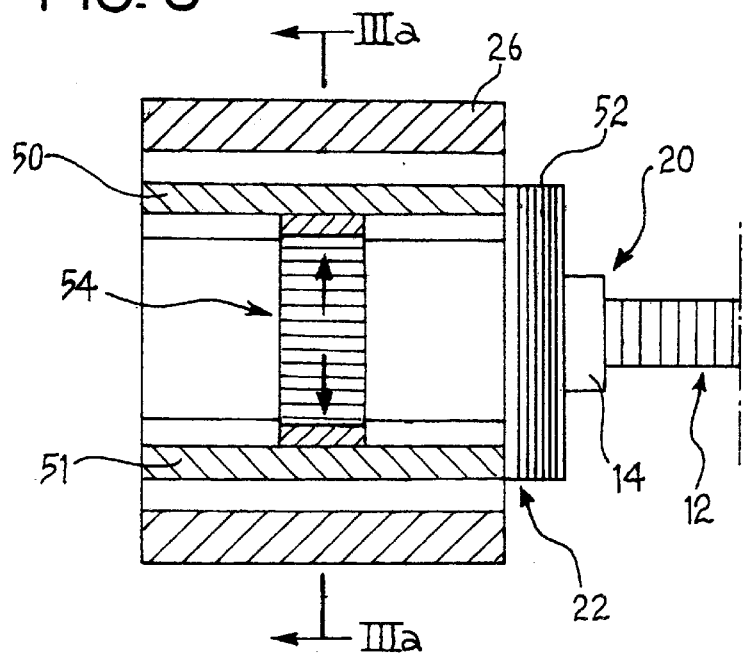
FIG. 3 shows, in longitudinal section, a detail of a third embodiment of the device according to the invention, in which the coupling between the piezoelectric actuating member and the fixed reference body of the valve is achieved by piezoelectric means.
Figure 3A:
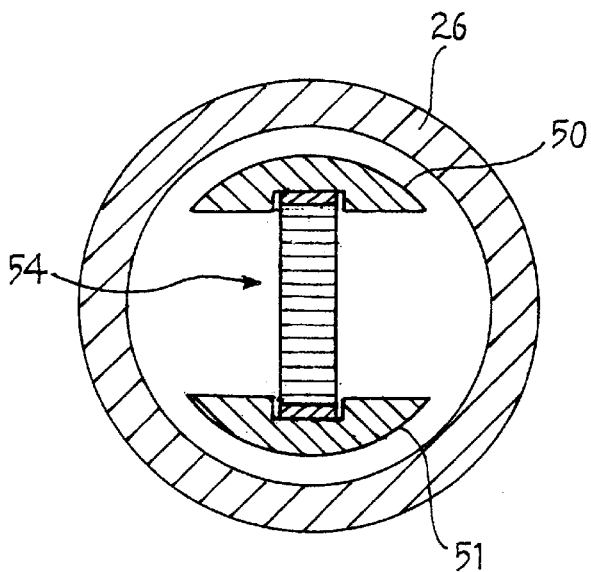
FIG. 3a is a cross-section taken on the line IIIa—IIIa of the device of FIG. 3.

A further embodiment, in which, in contrast, the connection between the actuating member 12 and the fixed reference body 26 of the valve is achieved by piezoelectric means instead of electromagnetic means is shown in FIGS. 3 and 3a, with particular reference to the differences with respect to the preferred solutions described above.

The intermediate movable support member 22 in the connection between the piezoelectric actuating member 12 and the fixed reference body 26 of the valve comprises a pair of opposed sliding blocks 50, 51 arranged longitudinally in at least a portion of the cup-shaped body 26. The support member also comprises a connecting element 52 which connects the sliding blocks 50, 51 to one another and to a first end 20 of the piezoelectric member 12.

According to this embodiment, the adjustable connection is achieved by means of a piezoelectric locking member 54 arranged diametrally between the sliding blocks 50, 51. Naturally, the mechanical deformation (the "travel") of the locking member 54 owing to the piezoelectric effect must advantageously be greater than the distance which separates the sliding blocks from the side wall of the fixed body 26, taking account of the mechanical tolerances, of any thermal expansion, and of the long-term dimensional stability of the mechanical components involved.

As will be understood from the drawings, the piezoelectric locking member 54 always acts on the blocks 50, 51 in compression, bringing them into contact with the inner wall of the fixed body 26 and stopping any possible sliding of the support member 22 by friction, as in a drum braking system. To facilitate the travel of the sliding blocks during locking operations, the connecting element 52 advantageously has a structure with radial flexibility achieved, for example, by the provision of longitudinal notches.

A further alternative solution (not shown) which is included within the scope of the present invention, provides for the movable support member 22 to be locked to the fixed body 26 by means of one or more check members. These members may be fixed firmly to the fixed body 26 or to the support member 22 and may advantageously be operated hydraulically, for example, by means of some of the fluid controlled by the valve, used in recirculation.

In the above-described embodiments, the integration of the electronic control for the adjustment of the connection between the piezoelectric actuating member 12 and the fixed reference body 26 with the electronic control of the actuator device is also important.

Figure 4:
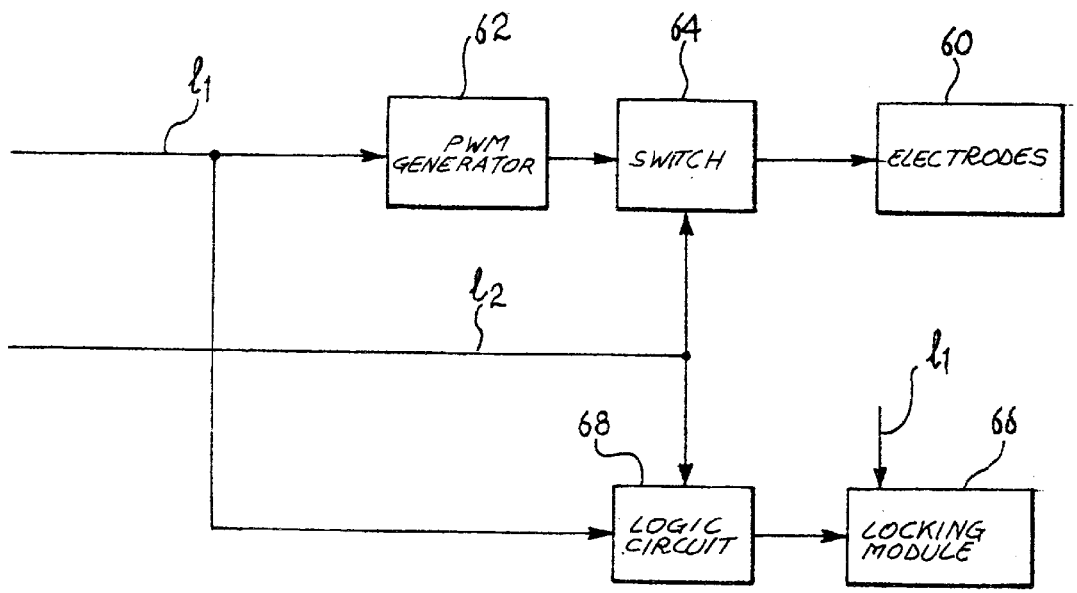
FIG. 4 is a block circuit diagram of a control circuit for an actuator device according to the invention.

FIG. 4 is a functional block diagram of a preferred control circuit. The electrodes 14, 16 of the piezoelectric actuating member 12 are indicated in the single block 60. The valve is actuated by means of electrical excitations induced in the electrodes in the form of a pulse-width-modulated pulse-train produced by a generator 62 supplied by an electrical supply via the connection $l_1$. The pulse generator 62 is connected to the electrode block 60 by means of a switch 64 which is controlled at a driving input by an injection-control circuit (not shown), via the connection $l_2$.

The block 66 indicates the circuit module for locking the reference for the actuating member 12 according to one of the solutions described (the electromagnet 40 or the piezoelectric locking member 54), this module also being supplied by the electrical supply, via the connection $l_1$.

The input of the circuit module 66 is connected to a locking logic circuit 68 which receives its supply via the connection $l_1$ and is driven by the injection-control circuit (not shown) via the connection $l_2$, in common with the switch 64.

According to the preferred solution described, the length of the electrical connections, particularly of the high-voltage connections, is advantageously reduced and logic circuits for controlling the activation of the valve and for the adjustment of the reference system for the actuating member may be formed on a single substrate.

Naturally, the principle of the invention remaining the same, the forms of embodiment and details of construction may be varied widely with respect to those described and illustrated purely by way of non-limiting example, without thereby departing from the scope of protection of the present invention defined by the appended claims.

What is claimed is:

1. A control valve, comprising:
   a closure member movable between a valve opening work position and a valve closing rest position, and
   an actuator device, including
      a fixed portion,
      a piezoelectric actuating member having a reference portion for connection to said fixed portion and a free portion rigidly connected to the closure member and movable relative to the reference portion as a result of mechanical deformations produced in the actuating member by the piezoelectric effect,
      urging means adapted to maintain the closure member in said valve rest position when the piezoelectric actuating member is not excited, and
      locking means operable to selectively
         retain said reference portion of the actuating member in a previously determined reference position in which said reference portion is fixed firmly to said fixed portion so that excitation of the actuating member is adapted to cause actuation of the valve, or
         free said reference portion in an adjustment or tuning condition relative to the fixed portion while the actuating member is not excited so that the reference portion is allowed to reach a newly determined reference position relative to the fixed portion while said urging means keep the closure member in the valve rest position.

2. A control valve according to claim 1, wherein said urging means comprise a reaction spring associated with the fixed portion of the actuator device or with a fixed structure of the valve and acting on the free portion of the actuating member.

3. A control valve according to claim 1, wherein the reference portion of the actuating member is held on a support member movable relative to the fixed portion of the actuator device.

4. A control valve according to claim 3, wherein the fixed portion of the actuator device has a cup-shaped portion in the cavity of which the actuating member is arranged axially, and the support member can slide axially in the cavity.

5. A control valve according to claim 4, wherein the support member can be locked relative to the fixed portion of the actuator device by magnetic attraction towards said fixed portion.

6. A control valve according to claim 5, wherein the locking means comprise an electrical winding associated with the fixed portion of the actuator device and arranged substantially coaxially with the support member, the support member being capable of being attracted magnetically radially towards the fixed portion of the actuator device when the winding is energized.

7. A control valve according to claim 4, being arranged to direct some of the fluid controlled by said valve into a space provided between the support member and the fixed portion of the actuator device, so as to lubricate the portions.

8. A control valve according to claim 4, wherein the support member can be locked relative to the fixed portion of the actuator device by friction.

9. A control valve according to claim 8, wherein the locking means comprise at least one pair of opposed sliding blocks associated with the support member and a corresponding piezoelectric locking member arranged diametrally between the blocks for moving the sliding blocks apart to bring them into contact with the fixed portion of the actuator device as a result of mechanical deformations induced in the locking member by the piezoelectric effect.

10. A control valve according to claim 1, wherein the locking means comprise a plurality of check members associated with the fixed portion of the actuator device for engaging the piezoelectric actuating member as a result of an activation control imparted by hydraulic means.

11. A control valve according to claim 1, wherein the actuator device can be controlled by means of an electronic driver circuit and comprises an electronic control circuit for the locking means, integrated with said driver circuit.

12. A control valve according to claim 11, wherein the electronic control circuit is arranged for periodic activation of the locking means.

13. A control valve according to claim 11, wherein the actuator device is arranged to direct some of the fluid controlled by the valve towards the electronic control circuit of the locking means and the driver circuit, so as to enable the circuits to be cooled.

* * * * *